United States Patent [19]

Peter et al.

[11] Patent Number: 5,685,069

[45] Date of Patent: Nov. 11, 1997

[54] DEVICE FOR CONTACTING ELECTRIC CONDUCTORS AND METHOD OF MAKING THE DEVICE

[75] Inventors: Cornelius Peter; Peter-Josef Bauer, both of Buehl, Germany

[73] Assignee: Robert Bosch GmbH, Stuttgart-Feuerbach, Germany

[21] Appl. No.: 390,583

[22] Filed: Feb. 17, 1995

[30] Foreign Application Priority Data

Feb. 17, 1994 [DE] Germany ............... 44 04 986.2

[51] Int. Cl.[6] .................................................. H01R 43/00
[52] U.S. Cl. ........................................... 29/827; 437/220
[58] Field of Search ............... 29/827, 840; 257/666, 257/672; 437/220

[56] References Cited

U.S. PATENT DOCUMENTS

| | | | |
|---|---|---|---|
| 3,317,287 | 5/1967 | Caracciolo | 29/827 X |
| 3,469,684 | 9/1969 | Keady et al. | 29/827 X |
| 3,908,075 | 9/1975 | Jackson et al. | 29/827 X |
| 4,997,517 | 3/1991 | Parthasarathi | 29/827 X |
| 5,072,519 | 12/1991 | Mase | 29/840 |
| 5,389,191 | 2/1995 | Muramatsu et al. | 29/840 X |
| 5,396,701 | 3/1995 | Russell | 29/840 X |

OTHER PUBLICATIONS

"Handbuch der Leiterplattentechnik" [Circuit Board Handbook]. Eugen G. Leuze Publisher, Saulgau/Württ., Germany, pp. 122–137.

*Primary Examiner*—Carl J. Arbes
*Attorney, Agent, or Firm*—Spencer & Frank

[57] ABSTRACT

A method of making a device for establishing an electric contact with conductors of an electric apparatus includes the following steps: forming a one-piece leadframe from sheet metal; securing the leadframe pattern to an electrically insulating carrier; severing the conductor into individual conductor strips; mounting an electric and/or electronic component on the carrier; and electrically contacting the components with selected conductor strips.

4 Claims, 1 Drawing Sheet

DEVICE FOR CONTACTING ELECTRIC CONDUCTORS AND METHOD OF MAKING THE DEVICE

CROSS REFERENCE TO RELATED APPLICATION

This application claims the priority of German Application No. P 44 04 986.2 filed Feb. 17, 1994, which is incorporated herein by reference.

BACKGROUND OF THE INVENTION

This invention relates to a device for contacting electric conductors, particularly conductors of electric motors and to a method of making such a device. The device includes electrically conducting connecting members mounted on an electrically insulating carrier. The connecting members extend from the conductors to electric terminals and are in electric contact with electric and/or electronic components.

Conventionally, for contacting coil wires of stator windings in electromotors, a conductor plate is arranged at the electric motor and is accommodated in an electrically insulating housing. The coil wires of the stator are extended to the conductor plate and are soldered to the electric and/or electronic components. Further, to the conductor plate a terminal plug is coupled for connection with the electric conductors. The plug and the conductor plate are accommodated in a housing. Such a device which is thus composed of a conductor plate and a plug is substantially labor-intensive as concerns the manufacture of the individual components and the mounting thereof on the electric apparatus.

SUMMARY OF THE INVENTION

It is an object of the invention to provide an improved device of the above-outlined type for reducing the number of components as compared to prior art constructions whereby manufacture and installation are simplified and rendered more economical.

This object and others to become apparent as the specification progresses, are accomplished by the invention, according to which, briefly stated, the method of making a device for establishing an electric contact with conductors of an electric apparatus includes the following steps: forming a one-piece conductor pattern leadframe from sheet metal; securing the conductor pattern to an electrically insulating carrier; severing the conductor pattern into individual conductor strips; mounting an electric and/or electronic component on the carrier; and electrically contacting the components with selected conductor strips.

Thus, by virtue of the invention a single structural unit may be used for connecting conductors with electric/electronic components. The structural unit according to the invention combines the electric and/or electronic components as well as the connecting plug. The method according to the invention provides for an economic manufacture of the device permitting a consecutive finishing of the device as a whole.

According to a particularly advantageous feature of the invention the electrically insulating carrier forms a housing for receiving the electric and/or electronic components and, at the same time, accommodates the terminal plug.

According to an advantageous feature of the method according to the invention, the sheet metal conductor pattern is stamped out from a sheet metal ribbon of undetermined length. It is further expedient to advance the carriers as multiple panels to a plurality of conductor pattern structures all connected to a stamped grid.

DESCRIPTION OF THE PREFERRED EMBODIMENTS

Figure 1:
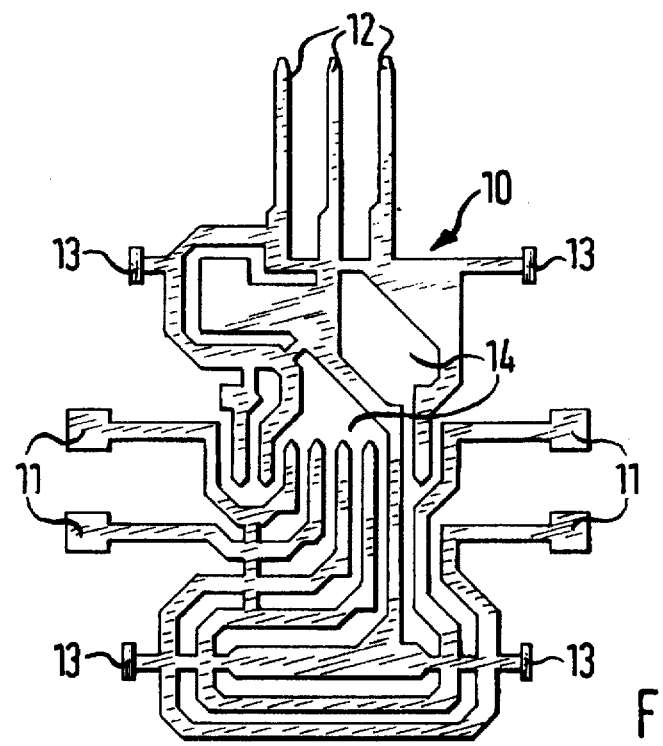
FIG. 1 is a top plan view of a conductor pattern as an intermediate product, formed of sheet metal.

Turning to FIG. 1, there is illustrated therein a one-piece conductor pattern (hereinafter referred to as leadframe) generally designated at 10 formed, for example, by stamping, from a sheet metal blank which may be copper or a copper alloy and having a thickness of, for example, 0.63 mm. The leadframe 10 has, for example, four terminal tabs 11 and, for example, three plug-in contacts 12. The latter are designed as contacts for a non-illustrated terminal cable.

In the course of the leadframe shaping operation openings 14 are provided in the leadframe 10 in such a manner that a coherent, one-piece conductor structure is obtained. The leadframe 10 obtained in this manner has a closed-circuit configuration and thus initially has no conductor portions that are electrically separated from one another. Further, securing (mounting) lugs 13 are formed on the leadframe 10.

Figure 2:
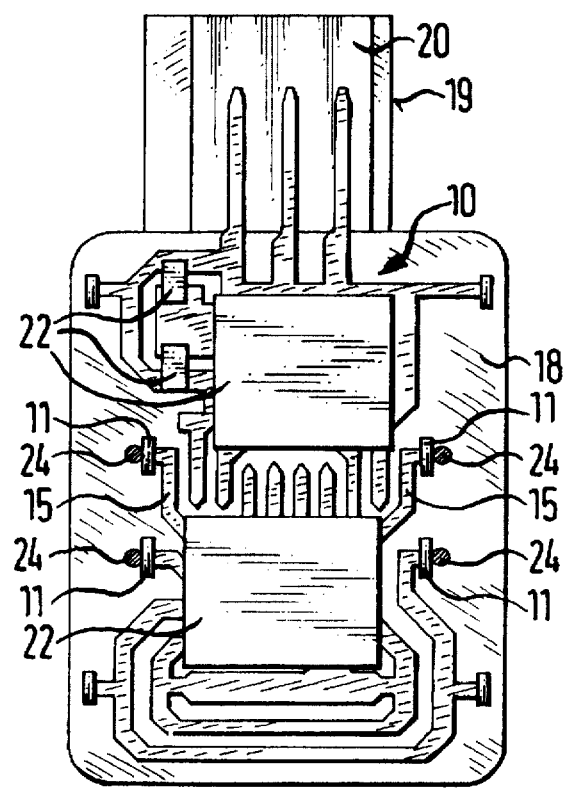
FIG. 2 is a top plan view of a preferred embodiment of the invention, illustrating the finished product.

Turning to FIG. 2, the leadframe 10 is mounted on an electrically insulating carrier 18. The mounting and immobilization of the leadframe 10 on the insulating carrier 18 may be effected by snapping the securing lugs 13 of the leadframe 10 into corresponding, non-illustrated apertures provided in the carrier 18. The carrier 18 has an extension 19 into which the prongs 12 of the leadframe 10 extend whereby a terminal plug 20 is obtained.

The separation of the leadframe 10 into individual, electrically mutually insulated leadframe portions composed of conductors 15, necessary to provide the conductor connections is effected after securing the leadframe 10 on the carrier 18. Thereafter the electric and/or electronic structural components 22 are soldered to the appropriate individual conductor portions 15. The terminal tabs 11 are bent vertically upwardly and connected with the conductors 24 of a non-illustrated electric device, such as an electric motor.

The carrier 18 provided with the conductors 15 and the structural components 22 is secured to the electric device, for example, to an electric motor which has, for example, four coil wires which belong to a stator winding and which have terminal portions 24 led through the carrier 18 and connected with the terminal tabs 11 by soldering or welding. It will be understood that the electric connection may be obtained by other means such as bonding with an electrically conducting paste or by winding.

For making the device according to the invention, the leadframe 10 are stamped, for example, from a metal strip of indefinite length, by means of a stamping process in which the individual leadframe 10 are held together in a stamped grid. By stamped grid there is meant the scrap material of the metal strip remaining after the stamping operation. The individual leadframe 10 remain connected to the stamped grid by web portions until separation occurs.

Thereafter, the carrier 18 is advanced to the leadframe 10 held by the stamped grid and the leadframe 10 are secured to the carrier 18. The carrier 18 may be a multipanel member so that, for example, three leadframe 10 arranged in sequence in the stamped grid may be set on three interconnected carriers 18 and secured thereto. In the alternative, the carrier 18 may be provided by spraying it on the leadframe 10.

After securing the leadframe 10 to the carrier 18, the leadframe 10 is severed in such a manner that separated conductor portions 15 are obtained for subsequently contacting the electric and/or electronic components 22. The severing operation may be performed mechanically or with a laser beam.

After securing the leadframe 10 to the carrier 18 and after separating it into individual conductors 15, the stamped grid is removed so that the conductors 15 remain connected to the carriers 18. The removal of the stamped grid, that is, the separation of the individual leadframes 10 from one another may be also effected before the separation of each leadframe 10 into individual conductors 15.

As a subsequent process step, the terminal tabs 11 are bent upwardly perpendicularly to the carrier 18. Thereafter, the individual conductors 15 are, in a subsequent processing station, provided with the components 22. Before such step, however, the terminal contacts of the components 22 are provided with a soldering paste. The connection of the conductors 15 with the components 22 is effected in case of a multipanel carrier 18, for example, in such a manner that the individual conductors 15 present for the multipanel carrier 18 are provided in one process step with the components 22. Thereafter, the conductors 15 mounted on the carrier plate 18 and associated with the components 22 are advanced to a soldering device in which the components 22 are soldered to the conductors 15, for example, in a reflow soldering process. Subsequently, the separation of the multipanel carriers 18 occurs so that eventually there is provided a single device mounted on the carrier 18 and having conductors 15 with components 22 electrically connected thereto. The device obtained in accordance with the above-described process is utilized for contacting electric devices. For this purpose, the carrier 18 is mounted on the electric device and the conductor terminals of the device are connected with the terminal tabs 11 of the conductors 15. After mounting the electric device the carrier 18 is provided with a non-illustrated cover so that the conductors 15 and the components 22, including the plugs 12 are surrounded by a housing.

It will be understood that the above description of the present invention is susceptible to various modifications, changes and adaptations, and the same are intended to be comprehended within the meaning and range of equivalents of the appended claims.

What is claimed is:

1. A method of making a device for establishing an electric contact with terminals of an electric apparatus, comprising the following steps:

(a) forming, from a sheet metal member, a one-piece leadframe composed of a pattern of interconnected conductor strips and terminal leads;

(b) securing the leadframe to an electrically insulating carrier;

(c) after step (b), severing said leadframe into electrically mutually insulated leadframe portions each being composed of at least one of said conductor strips and at least one of said terminal leads;

(d) applying a soldering paste to said terminal leads;

(e) after step (c), mounting electric or electronic components on said carrier and electrically contacting said components with selected conductor strips;

(f) soldering said components to said selected conductor strips; and (g) connecting the terminals of said apparatus with the terminal leads of said leadframe.

2. The method as defined in claim 1, wherein said forming step comprises the step of forming said one-piece leadframe from a sheet metal strip of indeterminate length.

3. The method as defined in claim 1, wherein said securing step comprises the step of connecting said carrier to the leadframe as multipanel carriers and further comprising the step of dividing the multipanel carriers into individual carriers after contacting with the conductor strips.

4. The method as defined in claim 1, wherein said forming-step comprises the step of stamping the leadframe from the sheet metal.

* * * * *